(12) United States Patent
Song (10) Patent No.: US 7,026,662 B2
(45) Date of Patent: Apr. 11, 2006

(54) SEMICONDUCTOR DEVICE HAVING A PHOTON ABSORPTION LAYER TO PREVENT PLASMA DAMAGE

(75) Inventor: Seung-Chul Song, Sung-Nam (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 34 days.

(21) Appl. No.: 10/740,570

(22) Filed: Dec. 22, 2003

(65) Prior Publication Data

US 2004/0178419 A1 Sep. 16, 2004

(51) Int. Cl.
*H01L 33/00* (2006.01)

(52) U.S. Cl. .................. 257/103; 257/79; 136/256; 136/261; 438/57; 438/71

(58) Field of Classification Search .................. 257/79; 136/256, 261; 438/57, 71
See application file for complete search history.

(56) References Cited

U.S. PATENT DOCUMENTS 5,480,814 A 1/1996 Wuu et al.

6,410,210 B1 6/2002 Gabriel ........................ 430/315
2004/0099867 A1* 5/2004 Leng et al.

OTHER PUBLICATIONS

Seung-Chul Song, Avoiding Plasma Induced Damage to Gate Oxide, etc . . . , 2002, 72-73.

* cited by examiner

*Primary Examiner*—Mai-Huong Tran
(74) *Attorney, Agent, or Firm*—Lee & Morse, P.C.

(57) ABSTRACT

A MOSFET device structure and a method of manufacturing the same, in which a photon absorption layer is formed over a gate structure and a substrate in order to avoid plasma induced damage to the gate oxide during high density plasma deposition of a interlayer dielectric layer. The device structure may include an etch stop layer below the photon absorption layer. The photon absorption layer is formed entirely of silicon germanium or it may be a multi-layer formed of a silicon layer and a silicon germanium layer. In the multi-layer structure the silicon germanium layer may be formed on top of the silicon layer or vice-versa. The silicon germanium layer may be formed by implanting germanium ions into a silicon layer or by an epitaxial growth of the silicon germanium alloy layer. In the photon absorption layer the germanium may be substituted by another element whose band gap energy is less than that of silicon.

12 Claims, 5 Drawing Sheets

SEMICONDUCTOR DEVICE HAVING A PHOTON ABSORPTION LAYER TO PREVENT PLASMA DAMAGE

BACKGROUND OF THE INVENTION

1. Field of the Invention

The present invention relates to a semiconductor device structure and a processing method thereof for preventing plasma-induced-damage to the device during plasma processing. More particularly, the present invention is directed to a MOSFET semiconductor device structure and a processing method thereof for preventing plasma-induced-damage to the gate oxide during high-density plasma deposition of an interlayer dielectric layer.

2. Description of the Related Art

As ultra large scale integration (ULSI) technology has progressed, the use of plasma processes for etching and deposition has increased. Plasma deposition is a preferred process because it offers a good thermal budget control due to a low process temperature. Plasma deposition and etching offer a high directionality that can result in high gap-fill capability during deposition. A plasma process inherently produces photons. When these photons are absorbed by the gate oxide, they induce damage. This damage is called plasma-induced-damage (PID). The PID degrades gate oxide reliability and may increase the probability of device failure. The PID in gate oxide leads to gate leakage current.

Though the PID to the gate oxide has been considered acceptable in the past, recently, due to the use of thinner gate oxides and use of high-density plasma (HDP) deposition and etching techniques, a substantial amount of PID is generated in the gate oxide, and accordingly additional consideration to avoid or minimize the PID damage to the gate oxide is necessary. The HDP deposition and etching processes are associated with greater amounts of photons, which in turn has the potential of more easily penetrating through the various layers of gate stack, and thereby inflicting more damage to the gate oxide. In fact, an amount of photons associated with the HDP may be sufficient to overcome the protection to the gate stack provided by a photon-absorbing layer formed on the gate stack. At present, the HDP process is widely used for interlayer dielectric layer deposition on the gate structures. Hence, the PID to the gate oxide layer in this process needs to be eliminated or minimized to obtain high device performance. The PID problem of the gate oxide layer is explained below, more clearly, with reference to FIGS. 1 and 2.

Figure 1:
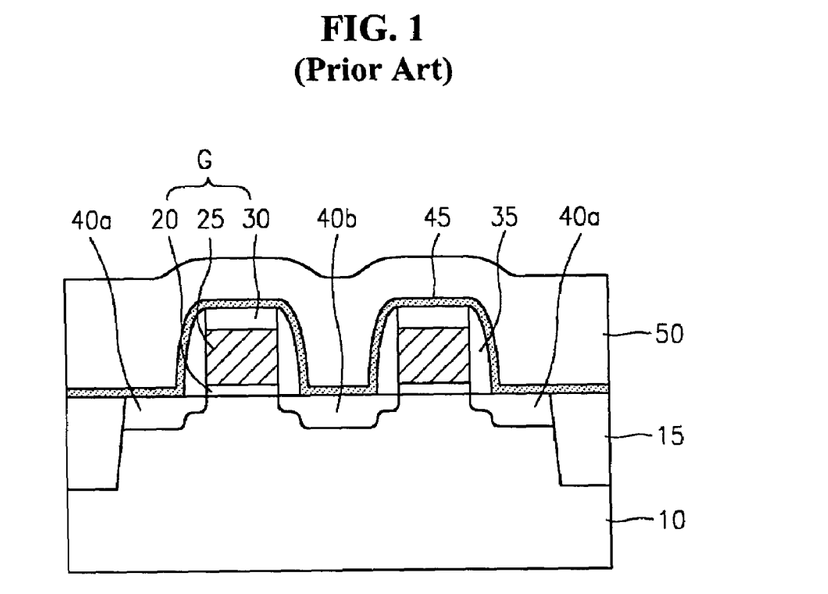
FIG. 1 illustrates a cross-sectional view of a conventional MOS transistor structure.

FIG. 1 illustrates the structure of a conventional MOS transistor. An isolation region 15, a gate oxide layer 20, a gate conductive layer 25, and a gate hard mask 30 are formed on a silicon substrate 10. The hard mask layer 30, the gate conductive layer 25, and the gate oxide layer 20 are patterned and these three layers together form a gate structure (G). A shallow lightly doped portion of the source/drain regions 40*a* and 40*b* is formed by ion-implantation. Next, a gate spacer 35 is formed on the gate structure (G). Then, impurities are implanted into the substrate to form heavily doped deep portions of the source/drain regions 40*a* and 40*b* of the MOS transistor. Next, an etch stop layer 45 is formed on the resultant structure. The etch stop layer 45 is formed to protect the active surface of source/drain regions 40*a* and 40*b*, and contact holes are formed by etching through an interlayer dielectric layer 50 formed in the next step.

Conventionally, the etch stop layer 45 is made of silicon oxy-nitride (SiON) or silicon nitride (SiN). Next, an interlayer dielectric layer 50 is deposited on the etch stop layer 45. A HDP process is used to form the interlayer dielectric material in a narrow space between adjacent gate structures (G). The HDP process, however, has a problem in that it generates photons at a high density level. As a result, the photons are absorbed into the gate oxide layer 20 during the interlayer dielectric layer 50 deposition process, and a gate leakage current is generated.

Figure 2:
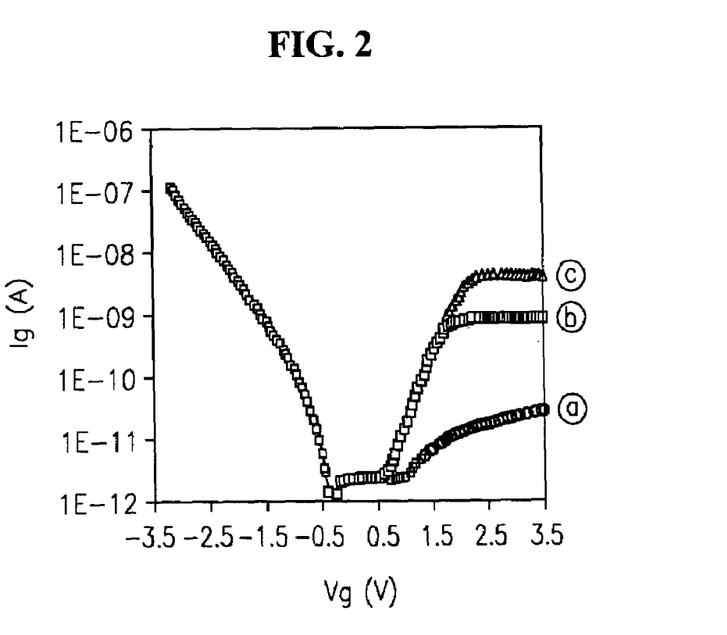
FIG. 2 is a graph showing gate current variation with gate voltage, with no bias applied to (floating) source and drain terminals, when an interlayer dielectric layer is deposited â without using a high density plasma process, ƀ using a high density plasma process, and ĉ using a high density plasma process for a longer period of time than ƀ)

The gate leakage current problem is explained more specifically with reference to FIG. 2. FIG. 2 illustrates a gate current variation with the gate voltage, with no bias connected to the source/drain terminals, and when interlayer dielectric layer 50 is formed with or without using the HDP process. After the HDP deposition process, when a voltage is applied to the gate conductive layer 25, a leakage current is generated in the gate oxide 20. In FIG. 2, a plot designated with label â shows a leakage current (Ig) in the gate oxide 20 when the interlayer dielectric layer 50 is deposited without using the HDP process. Plots designated with labels b̂ and ĉ show higher leakage currents in the gate oxide, as compared to the plot â, when the interlayer dielectric layer 50 is deposited using the HDP process. For the plot labeled ĉ, a longer HDP process time is used (hence, many more photons are generated) than that of b̂. The longer HDP process time resulted in a higher gate leakage current in plot ĉ as compared to plot b̂. This phenomenon of increased leakage current of the gate oxide with exposure to a plasma process is plasma induced damage (PID).

Figure 3:
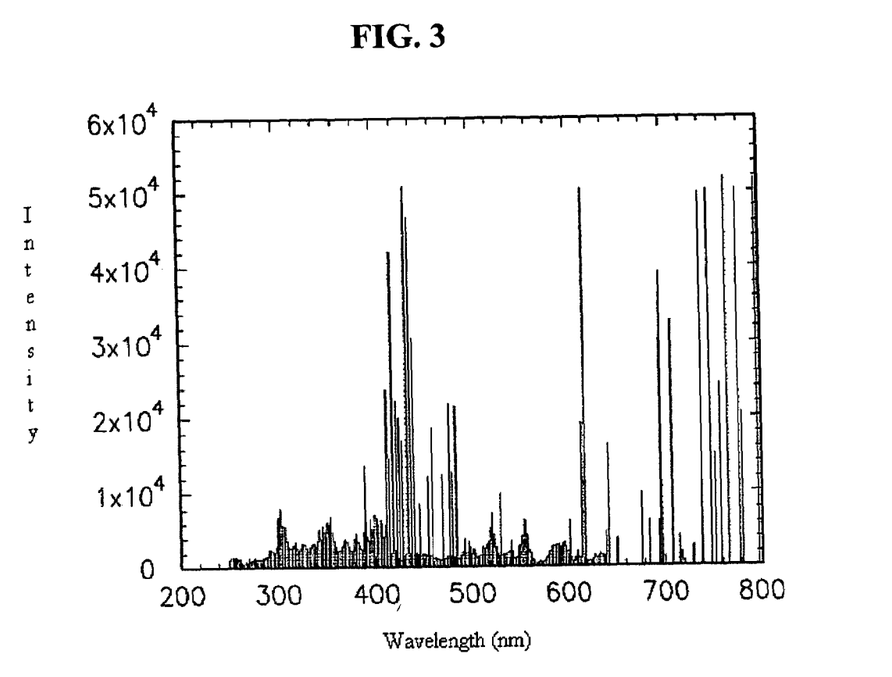
FIG. 3 is a graph showing a typical light emissions spectrum associated with a high-density plasma process, in the wavelength range of 200–800 nm.

A wavelength of photons generated during the HDP process is in a range of 300–800 nm, as illustrated in FIG. 3. An etching stop layer 45 made of SiN does not easily absorb photons having a wavelength higher than 300 nm. The extinction coefficient k of silicon nitride is nonzero for wavelengths below 200 nm, peaking at 1.5 for wavelengths around 100 nm. The k value of silicon nitride is essentially zero (0) for wavelengths greater than 200 nm. The k value of $SiO_2$ is essentially zero (0) for wavelengths greater than about 200 nm. For SiON, which is a mixture of $SiO_2$ and SiN, the k value is expected to be zero for wavelengths greater than 200 nm. Hence, silicon nitride or SiON, when used for forming the etch stop layer 45, are ineffective in absorbing photons with wavelengths greater than 200 nm, and protecting the gate oxide layer 20 against PID during HDP deposition of the interlayer dielectric layer 50. Due to the above reasons a new approach is desired to prevent or minimize the PID of the gate oxide layer 20, during HDP deposition of the interlayer dielectric layer 50.

SUMMARY OF THE INVENTION

The present invention is directed to preventing or minimizing the PID problem in gate oxide during the HDP deposition process of the interlayer dielectric layer. One of the main features of the present invention involves providing a means for absorbing the photons, in the wavelength range of 300–1200 nm, generated during the HDP process, by inserting a photon absorption layer, which is made of a material having a lower bandgap energy than SiN or SiON.

In the present invention, a silicon germanium layer or both silicon layer and silicon germanium layers together are used as the photon absorption layers.

According to a feature of an embodiment of the present invention, there is provided MOSFET semiconductor device structures for preventing plasma-induced-damage in the gate oxide during high-density plasma deposition of an interlayer dielectric layer.

The present invention also provides methods of fabricating MOSFET semiconductor device structures intended for preventing plasma-induced-damage in the gate oxide during high-density plasma deposition of an interlayer dielectric layer.

According to an embodiment of the present invention, there is provided a semiconductor device, including a substrate, a gate structure formed on the substrate, a photon absorbing layer having a silicon germanium layer formed over the gate structure and the substrate, and an interlayer dielectric layer formed over the photon absorbing layer. An etch stop layer may be formed between the gate structure and the photon absorbing layer. The etch stop layer may be formed of SiN or SiON.

According to another embodiment of the present invention, there is provided a semiconductor device, including a substrate, a gate structure formed on the substrate, a multi-layer photon absorbing layer having a silicon layer and a silicon germanium layer formed over the gate structure and the substrate, and an interlayer dielectric layer formed over the multi-layer photon absorbing layer. An etch stop layer may be formed between the gate structure and the multi-layer photon absorbing layer. The etch stop layer may be formed of SiN or SiON.

According to yet another embodiment of the present invention, there is provided a semiconductor device, including a substrate, a gate structure formed on the substrate, a silicon layer containing at least one impurity formed over the gate structure and the substrate, the impurity having a band gap energy lower than a band gap energy of silicon, and an interlayer dielectric layer formed over the silicon layer containing at least one impurity. An etch stop layer may be formed between the gate structure and the silicon layer containing the at least one impurity. The etch stop layer may be formed of SiN or SiON.

According to an embodiment of the present invention, there is provided a method of manufacturing a semiconductor device, including forming a gate structure on a substrate, forming a silicon layer containing at least one impurity over the gate structure and the substrate, the at least one impurity having a band gap energy less than about 1.1 eV, and forming an interlayer dielectric layer formed over the silicon layer containing at least one impurity. According to a feature of this embodiment of the present invention, the silicon layer containing the at least one impurity may be formed by ion implantation of the impurity into the silicon layer. According to another feature of this embodiment of the present invention, the impurity may be implanted into the silicon layer to a predetermined depth of the silicon layer, or the impurity may be implanted into the silicon layer to a full depth of the silicon layer. According to still another feature of this embodiment of the present invention, the impurity may be implanted into the silicon layer to a partial depth of the silicon layer. According to another feature of this embodiment of the present invention, the method may include forming an etch stop layer over the gate structure and the substrate before forming the silicon layer containing the at least one impurity. According to another feature of this embodiment of the present invention, the etch stop layer may be formed of SiN or SiON. According to yet another feature of this embodiment of the present invention, the impurity contained in the silicon layer may be germanium.

According to another embodiment of the present invention, there is provided a method of manufacturing a semiconductor device, including forming a gate structure on a substrate, forming a silicon layer over the gate structure and the substrate, forming a silicon layer containing at least one impurity over the silicon layer, the at least one impurity having a band gap energy less than about 1.1 eV, and forming an interlayer dielectric layer formed over the silicon layer containing at least one impurity. According to a feature of this embodiment of the present invention, the silicon layer containing the at least one impurity may be formed by ion implantation of the impurity into the silicon layer. According to another feature of this embodiment of the present invention, the impurity may be implanted into the silicon layer to a predetermined depth of the silicon layer, or the impurity may be implanted into the silicon layer to a full depth of the silicon layer. According to still another feature of this embodiment of the present invention, the impurity may be implanted into the silicon layer to a partial depth of the silicon layer. According to another feature of this embodiment of the present invention, the method of manufacturing a semiconductor device may further include forming an etch stop layer over the gate structure and the substrate before forming the silicon layer. According to another feature of this embodiment of the present invention, the etch stop layer may be formed of SiN or SiON. According to yet another feature of this embodiment of the present invention, the impurity contained in the silicon layer may be germanium.

According to yet another embodiment of the present invention, there is provided a method of manufacturing a semiconductor device, including forming a gate structure on a substrate, forming a silicon germanium layer by epitaxial growth over the gate structure and the substrate, and forming an interlayer dielectric layer over the silicon germanium layer. According to a feature of this embodiment of the present invention, this method may further include forming an etch stop layer over the gate structure and the substrate before forming the silicon germanium layer. According to another feature of this embodiment of the present invention, the etch stop layer may be formed of SiN or SiON.

According to still another embodiment of the present invention, there is provided a method of manufacturing a semiconductor device, including forming a gate structure on a substrate, forming a silicon layer over the gate structure and substrate, forming a silicon germanium layer by epitaxial growth over the silicon layer, and forming an interlayer dielectric layer over the silicon germanium layer. According to a feature of this embodiment of the present invention, the method of manufacturing a semiconductor device may further include forming an etch stop layer over the gate structure and the substrate before forming the silicon layer. According to another feature of this embodiment of the present invention, the etch stop layer may be formed of SiN or SiON.

According to an embodiment of the present invention, there is provided a method of manufacturing a semiconductor device, including forming a gate structure on a substrate, forming a silicon germanium layer by epitaxial growth over the gate structure and the substrate, forming a silicon layer over the silicon germanium layer; and forming an interlayer dielectric layer over the silicon layer. According to a feature of this embodiment of the present invention, the method of manufacturing a semiconductor device may further include forming an etch stop layer over the gate structure and the substrate before forming the silicon germanium layer. According to another feature of this embodiment of the present invention, the etch stop layer may be formed of SiN or SiON.

According to another embodiment of the present invention, there is provided a method of manufacturing a semiconductor device, including forming a gate structure on a substrate, forming a silicon germanium layer over the gate structure and the substrate by ion implanting germanium ions into a first silicon layer, forming a second silicon layer over the silicon germanium layer, and forming an interlayer dielectric layer over the silicon layer. According to a feature of this embodiment of the present invention, the method of manufacturing a semiconductor device may further include forming an etch stop layer over the gate structure and the substrate before forming the first silicon layer. According to another feature of this embodiment of the present invention, the etch stop layer may be formed of SiN and SiON.

According to still another embodiment of the present invention, there is provided a method of manufacturing a semiconductor device, including forming a gate structure on a substrate, forming a silicon layer over the gate structure and the substrate, forming a silicon germanium layer at a bottom part of the silicon layer immediately on top of the gate structure and the substrate by using germanium ions of a predetermined energy, and forming an interlayer dielectric layer over the silicon layer. According to a feature of this embodiment of the present invention, the method of manufacturing a semiconductor device may further include forming an etch stop layer over the gate structure and the substrate before forming the silicon layer. According to another feature of this embodiment of the present invention, the etch stop layer may be formed of SiN and SiON.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

Figure 4:
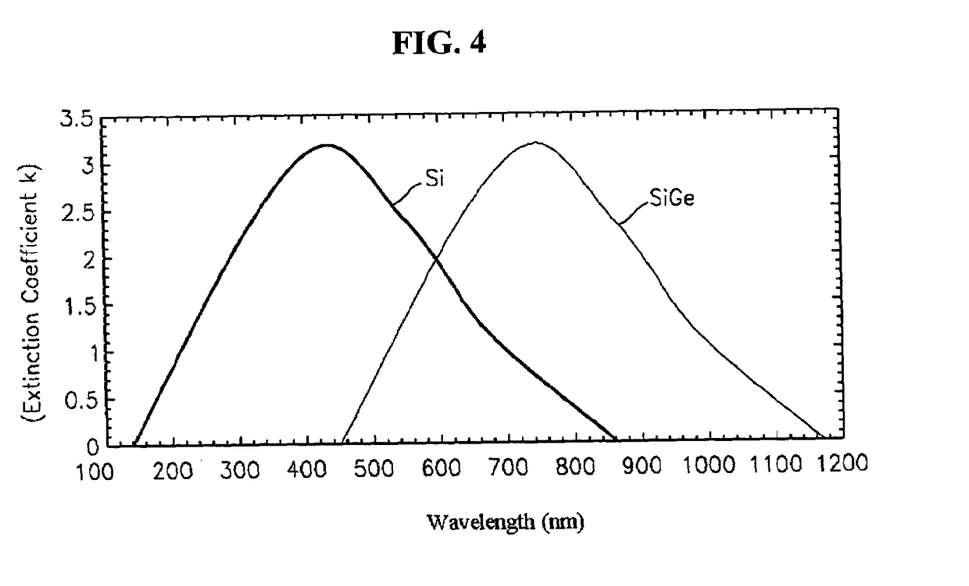
FIG. 4 is a graph showing a variation of an extinction coefficient k of Si and SiGe (mol percentage of 20% Si:80% Ge) with photon wavelength.

The bandgap energy of a silicon layer is approximately 1.1 eV at room temperature. Silicon has a nonzero extinction coefficient k in a wavelength range of 300–800 nm. For Si, a peak k value is about 3.2 at approximately 430 nm, with the k value falling on both decreasing and increasing wavelengths, as shown in FIG. 4. The k value decreases to less than 2 in a wavelength range of 600–800 nm.

Conventionally, absorption coefficient α and extinction coefficient k are explained according to the Beer-Lambert Law as shown in equations (1) and (2) below:

$$I=I_0 e^{-\alpha d} \quad (1)$$

$$\alpha=4\pi k/\lambda \quad (2)$$

In the above equations, I is the light intensity after it passes through an absorbing layer, and $I_0$ is the initial light intensity at the time of incidence and d is the thickness of the light absorbing layer. According to equation (2), the absorption coefficient α is proportional to the extinction coefficient k. Hence, the larger a value of k, the larger the absorption coefficient α. According to equation (1), if α increases, then I decreases exponentially, therefore more light is absorbed. Accordingly, most of the photons in the 300–600 nm wavelength range are absorbed by the silicon layer as a k value thereof is nonzero in this wavelength range with a peak value of 3.2 at around 430 nm. In addition, according to equation (1), I is inversely proportional to the thickness d of the absorbing layer. Accordingly, it is important to recognize that the thickness of the absorption layer is fixed according to the intensity of the photons impinging on the absorbing layer.

Figure 5:
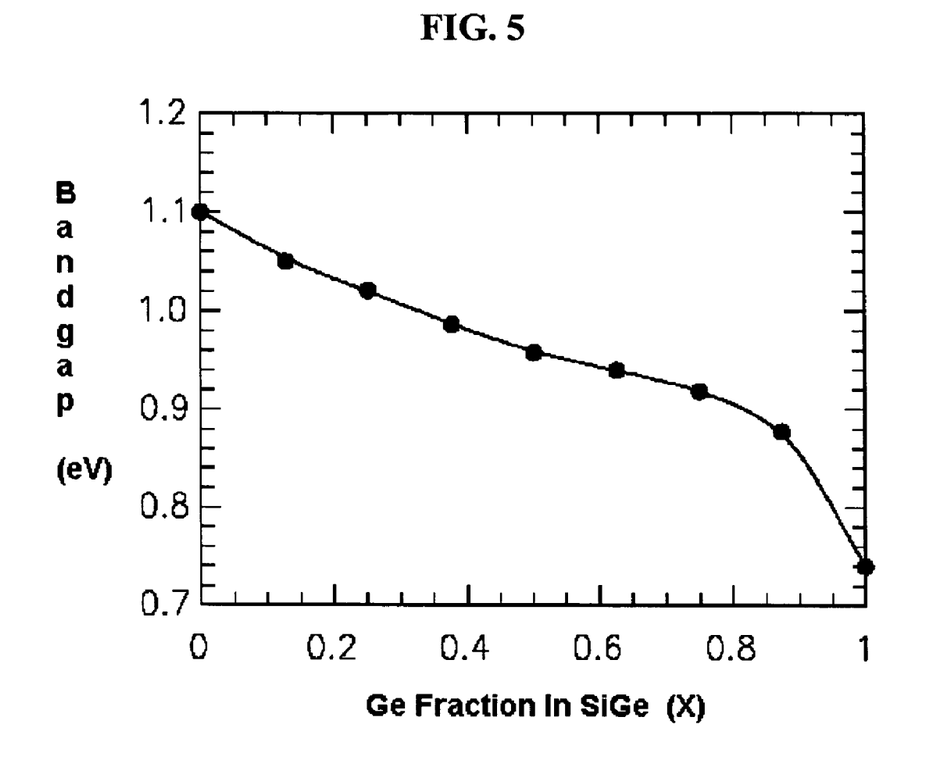
FIG. 5 is a graph showing a variation of an SiGe bandgap energy with a Ge atomic fraction in the SiGe compound.

Photons having wavelengths of 300–600 nm are easily absorbed by the silicon layer, which has a high extinction coefficient in the wavelength range of 300–600 nm. Photons having a wavelength greater than 600 nm, however, are not easily absorbed by the silicon layer as compared with photons having a wavelength in a range of 300 to 600 nm. However, when germanium is implanted into the silicon photon absorption layer, the bandgap of the photon absorption layer decreases with an increasing concentration of Ge, and photons having wavelengths greater than 600 nm are easily absorbed by the absorption layer. The variation of photon absorption layer bandgap energy with the percentage Ge concentration in the Si layer is shown in FIG. 5. As the quantity of Ge incorporated into the Si photon absorption layer increases, the bandgap energy of the photon absorption layer decreases from 1.1 eV to 0.7 eV. As the bandgap energy of the photon absorption layer decreases, photons having longer wavelengths can be absorbed.

The correlation between the bandgap energy and the characteristic photon wavelength is explained by equation (3).

$$E=h\nu=hc/\lambda \quad (3)$$

In equation (3), E is energy, h is Planck's constant, ν is the frequency of light, c is the speed of light, and λ is the wavelength of light. According to equation (3), E is inversely proportional to λ. Therefore, as the wavelength of the photon increases, its energy decreases. Hence to absorb photons of higher wavelength than 600 nm, the photon absorption layer should have a lower bandgap than that of Si.

FIG. 4 illustrates a change of absorption coefficient of a silicon germanium layer, which has a mol percentage of 20% silicon: 80% germanium, with the photon wavelength. It is clear from FIG. 4 that the silicon germanium layer can easily absorb photons having wavelengths of 600–900 nm. Hence, it is advantageous to incorporate Ge into the Si photon absorption layer, in order to extend the wavelength range of photons that can be absorbed by the photon absorption layer.

A detailed description of a device structure and a method of making the same according to a first embodiment of the present invention are provided below with reference to FIGS. 6A to 6C.

Figure 6A:
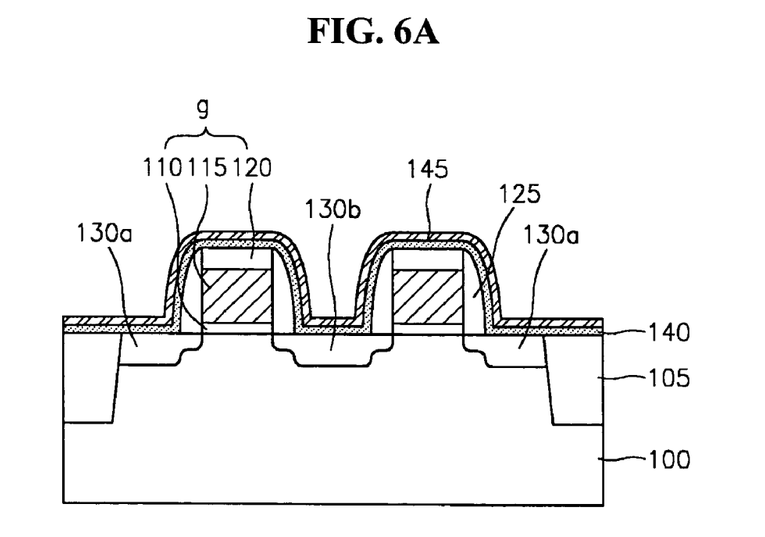
FIGS. 6A to 6C illustrate process flow steps via cross-sectional views of a device structure according to a first embodiment of the present invention.

Referring to FIG. 6A, a shallow trench isolation 105 is formed in a semiconductor substrate 100. A gate oxide 110, a gate conductive layer 115 and a hard mask 120 are formed on the substrate 100, in the stated order, and patterned to form a gate structure (g). Next, impurities are implanted into the substrate using the gate structure (g) as a mask to form shallow lightly doped portions (LDD) of source/drain regions 130a, 130b. Next, an insulating layer (not shown) is deposited on the gate structure. The insulating layer may be formed of silicon nitride (SiN). The insulating layer is etched, by an anisotropic etching process, to form a gate spacer 125. Next, a high-dose impurity can be implanted, by using the gate structure (g) and the spacer 125 together as an implant mask to form the heavily doped deeper portions of the source/drain regions 130a and 130b.

An interlayer dielectric (ILD) layer deposition on the resultant structure described above and contact hole formation through the ILD layer to connect the source/drain regions 130a, 130b are the next processing steps. At this time, before depositing and etching the ILD layer to form the contact hole, the surface of the source/drain regions must be protected to avoid damage during the etching of the interlayer dielectric layer 150 to form the contact hole. The gate structure (g) also needs to be protected to minimize the plasma-induced-damage (PID) of the gate oxide layer 110 during the ILD layer high-density plasma (HDP) deposition process step. Accordingly, an etch stop layer 140 is formed on the resultant structure described above. Normally, a material having a high etching selectivity compared to the interlayer dielectric layer 150 is used as the etch stop layer 140. For example, a silicon nitride layer (SiN) or a silicon oxy-nitride layer (SiON) may be used as the etch stop layer 140. Then, to minimize PID caused by the HDP process during the deposition of the interlayer dielectric layer 150, a photon absorption layer 145 is formed on the etch stop layer 140. Initially, the photon absorption layer 145 is entirely formed of Si. The thickness of the silicon layer is from 10 to 200 angstroms. The thickness of the silicon layer can be adjusted according to the thickness of the interlayer dielectric layer 150 or the time of HDP process. For example, in the case where the thickness of the interlayer dielectric layer 150 is 4000–5000 angstroms, the thickness of the photon absorption layer 145 is 50–70 angstroms. About 50% of the photons generated during the HDP process are absorbed for this thickness of the photon absorption layer. A plasma-enhanced chemical vapor deposition (PECVD) process may be used for depositing the photon absorption layer 145. Because the PECVD process has a good step coverage, the photon absorption layer 145 is formed uniformly on the etching stop layer 140. In addition, because the photon absorption layer 145 is relatively thin and has a process time of only 1–10 seconds, not enough photons are generated to cause any damage to the gate oxide layer 110, during the PECVD process.

Figure 6B:
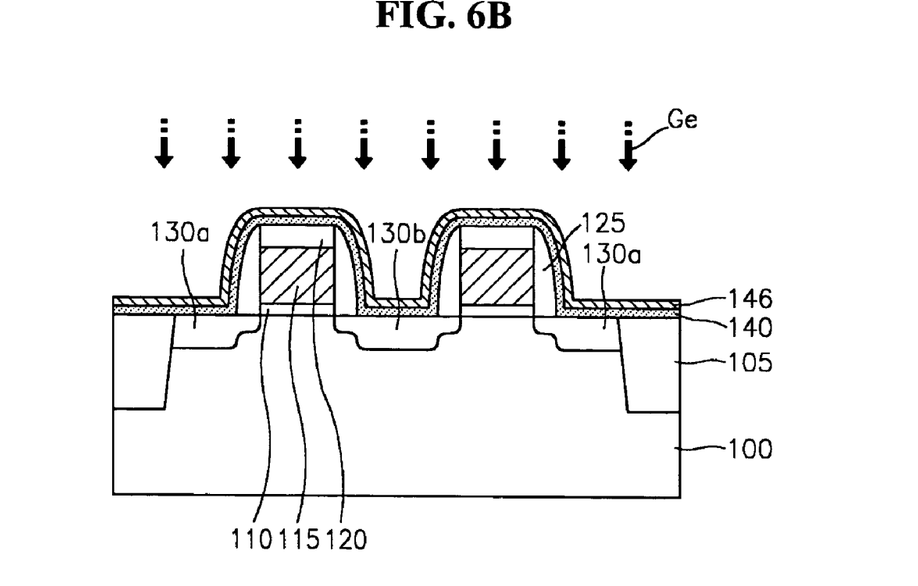

Next, as illustrated in FIG. 6B, an ion implantation process is used to implant germanium into the photon absorption layer 145, which is originally formed of Si. Germanium ion implanted silicon layer has a lower bandgap energy than the bandgap energy of silicon. As a result, a silicon germanium (SiGe) photon absorption layer 146 is formed. This means that the Si photon absorption layer 145 is converted by the Ge implantation into a SiGe photon absorption layer 146. Normally, germanium has a bandgap of about 0.7 eV. Accordingly, the bandgap energy of the photon absorption layer 146 is controlled according to the quantity of the germanium ions implanted into the original Si layer 145. The change in the bandgap energy of the SiGe photon absorption layer 146 with the atomic percentage of implanted Ge in the SiGe layer 146 is illustrated in FIG. 5. When the quantity of germanium implanted into the silicon layer 145 is increased, the bandgap energy of the photon absorption layer 146 is decreased from about 1.1 eV to 0.7 eV. As described above, as the bandgap energy of the photon absorption layer 146 is decreased, photons having longer wavelength can also be absorbed by the photon absorption layer 146. Photons having wavelengths between 300–600 nm are easily absorbed by the silicon layer 145. Photons having wavelengths greater than 600 nm, however, are difficult to be absorbed into the silicon layer 145. However, when germanium is implanted into the silicon layer 145, the bandgap of the photon absorption layer 146 decreases, and photons having wavelengths greater than 600 nm are easily absorbed. FIG. 4 illustrates changes in the absorption coefficients of the silicon and the silicon germanium (mol percentage of 20% Si:80% Ge) layers with the photon wavelength. Referring to FIG. 4, it is apparent that the silicon germanium (mol percentage of 20% Si:80% Ge) layer can easily absorb photons having wavelengths in the range of about 600–900 nm. Alternatively, the photon absorption layer 146 made of SiGe alloy may be formed by an epitaxial growth method, instead of by implanting Ge ions into the Si layer 145. Any other element whose bandgap is less than that of Si (1.1 eV) may also be used in place of Ge.

Figure 6C:
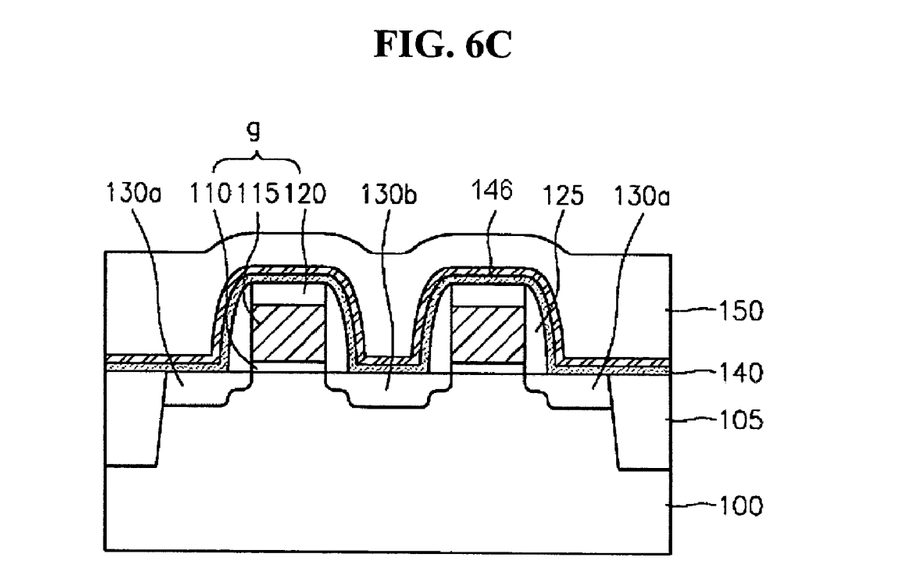

After completing the formation of the photon absorption layer 146, the interlayer dielectric layer 150 is formed, using the HDP process, as illustrated in FIG. 6C. The interlayer dielectric layer 150, formed using the HDP process, has a good fill deposition between the gate structures (g). Most of the photons generated during the HDP process, are absorbed by the photon absorption layer 146. Thus, a description of the device structure and a fabrication process thereof, according to a first embodiment of the present invention, are provided above.

A device structure and a method of making the device, according to second and third embodiments of the present invention, will now be are described with reference to FIGS. 7 and 8, respectively. Up to the formation of the etch stop layer 140, the method of making the devices of the second and third embodiments is the same as described for the first embodiment. Accordingly, the process description up to that point will not be repeated here.

Figure 7:
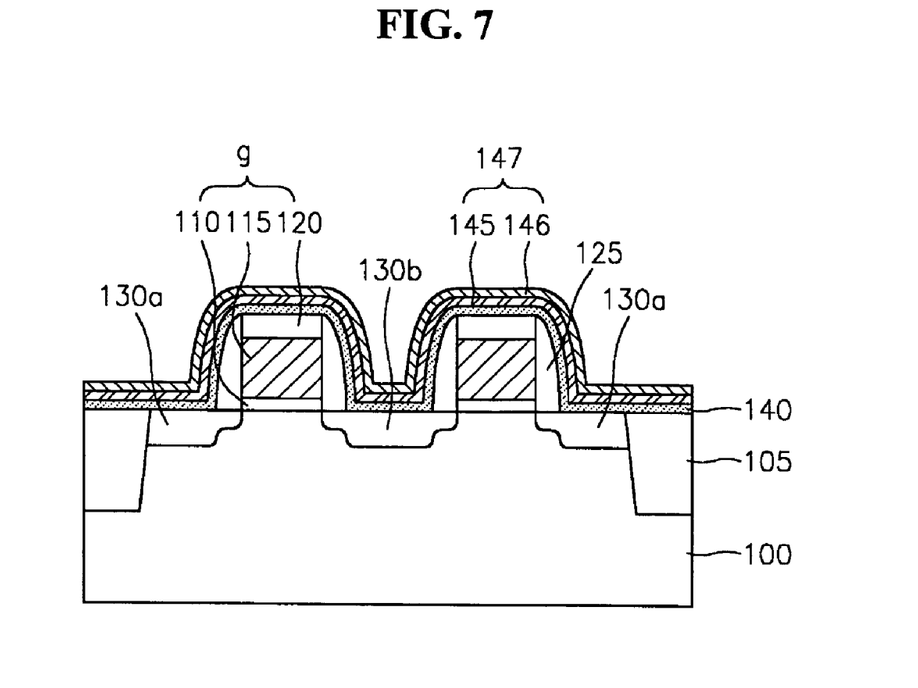
FIG. 7 illustrates a cross-sectional view of a device structure according to a second embodiment of the present invention.

As illustrated in FIG. 7, according to the second embodiment of the present invention, a silicon layer 145 and a silicon germanium layer 146 are formed on an etch stop layer 140. In this second embodiment of the present invention, a Si layer 145, having a thickness greater than that of the Si layer 145 formed in the first embodiment, is first formed. The process for forming the silicon layer 145 is similar to that of the first embodiment. In the second embodiment, after forming the silicon layer 145, an upper portion of the entire Si layer 145 is converted into a SiGe layer 146 by Ge ion implantation, in order to form a multi-layer photon absorption layer 147. Thus, the multi-layer photon absorption layer 147 in FIG. 7 is formed of a silicon layer 145 in the bottom, which is immediately on top of the etching stop layer 140, and a SiGe layer 146, which is immediately on top of the Si layer 145. The thickness of the SiGe layer may be controlled by regulating the Ge ion energy, and the percentage of Ge concentration in the SiGe layer may be controlled by regulating the Ge ion implantation dose. The percentage Ge concentration in the SiGe layer may be of any value between zero (0) and 100. Alternatively, the SiGe layer 146 of the multi-layer photon absorption layer 147 may also be formed by an epitaxial growth method on the silicon layer 145, instead of by implanting Ge ions into the Si layer 145. The multi-layer photon absorption layer of FIG. 7 absorbs photons with wavelengths in the range of 300–1200 nm, which are generated during the interlayer dielectric layer 150 HDP deposition process. The top SiGe (mol percentage of 20% Si:80% Ge) layer 146 absorbs photons in the wavelength range of 500–1200 nm, and the bottom Si layer 145 absorbs photons in the wavelength range of 300–800 nm. Any other element whose band gap is less than that of Si (1.1 eV) may be used in place of Ge. The process for forming the interlayer dielectric layer is similar to that of the first embodiment. The interlayer dielectric layer 150 is not shown in FIG. 7.

Figure 8:
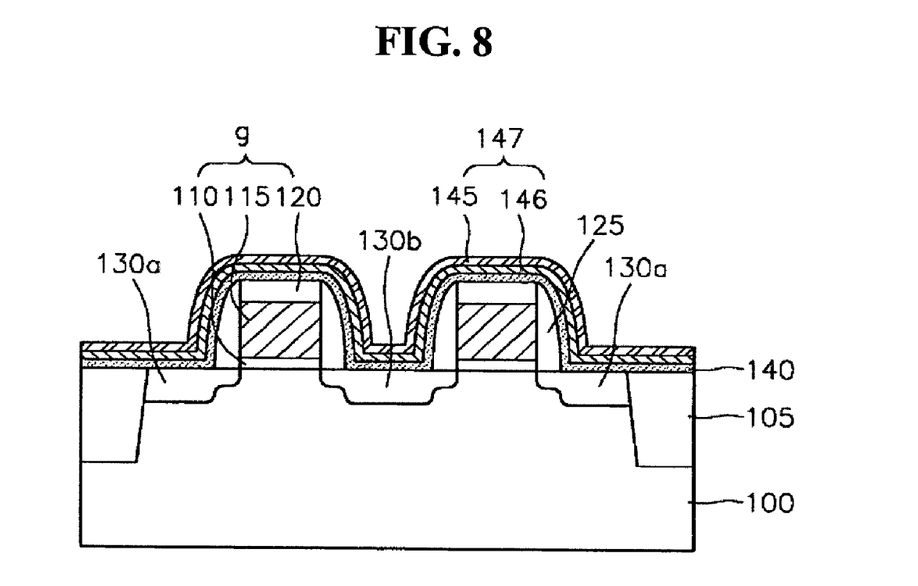
FIG. 8 illustrates a cross-sectional view of a device structure according to a third embodiment of the present invention.

The device structure illustrated in FIG. 8, according to a third embodiment of the present invention, is the same as that illustrated in FIG. 7, except that the order of Si layer 145 and the SiGe layer 146 in the multi-layer photon absorption layer 147 is reversed. Thus, the SiGe layer 146 is formed first, directly on top of the etching stop layer 140, and then the Si layer 145 is formed directly on top of the SiGe layer 146. The SiGe layer 146 may be formed by first forming a Si layer and then implanting the Si layer with Ge ions to convert it into a SiGe layer. The Si layer 145 is then formed on top of the SiGe layer 146 after completing the Ge ion implantation process of layer 146. The SiGe layer 146 may also be formed by implanting predetermined high-energy Ge ions into a thick Si layer. The process for forming the Si layer 145 in the third embodiment may be similar to that of the first embodiment. The predetermined high-energy Ge ions come to rest away from the upper part of the Si layer creating a buried SiGe layer 146 in a bottom part of the Si layer 145, leaving a Si layer 145 on the upper portion. Alternatively, both SiGe layer 146 and Si layer 145 may be formed by epitaxial growth techniques. The multi-layer photon absorption layer 147 of FIG. 8 is also effective in absorbing photons of wavelength in the range of 300–1200 nm (for SiGe mol percentage of 20% Si:80% Ge), which are generated during the HDP deposition of the interlayer dielectric layer 150. Any other element whose band gap is less than that of Si (1.1 eV) may be used in place of Ge. The process for forming the interlayer dielectric layer is similar to that of the first embodiment. The interlayer dielectric layer 150 is not shown in FIG. 8.

Preferred embodiments of the present invention have been disclosed herein and, although specific terms are employed, they are used and are to be interpreted in a generic and descriptive sense only and not for any purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
    a substrate;
    a gate structure formed on the substrate;
    a photon absorbing layer having a silicon germanium layer formed over the gate structure and the substrate, wherein the silicon germanium layer includes silicon and germanium in a molar ratio of about 20:80 Si:Ge; and
    an interlayer dielectric layer formed over the photon absorbing layer.

2. The semiconductor device as claimed in claim 1, further comprising an etch stop layer formed between the gate structure and the photon absorbing layer.

3. The semiconductor device as claimed in claim 2, wherein the etch stop layer is formed of SiN or SiON.

4. A semiconductor device, comprising:
    a substrate;
    a gate structure formed on the substrate;
    a multi-layer photon absorbing layer having a silicon layer and a silicon germanium layer formed over the gate structure and the substrate; and
    an interlayer dielectric layer formed over the multi-layer photon absorbing layer.

5. The semiconductor device as claimed in claim 4, wherein the silicon layer is below the silicon germanium layer.

6. The semiconductor device as claimed in claim 4, wherein the silicon layer is above the silicon germanium layer.

7. The semiconductor device as claimed in claim 4, further comprising an etch stop layer formed between the gate structure and the multi-layer photon absorbing layer.

8. The semiconductor device as claimed in claim 7, wherein the etch stop layer is formed of SiN or SiON.

9. The semiconductor device as claimed in claim 4, wherein the silicon germanium layer includes silicon and germanium in a molar ratio of about 20:80 Si:Ge.

10. A semiconductor device, comprising:
    a substrate;
    a gate structure formed on the substrate;
    a silicon layer containing at least one impurity formed over the gate structure and the substrate, the impurity having a band gap energy lower than a band gap energy of silicons wherein the at least one impurity is germanium, and the silicon layer including at least one impurity includes silicon and germanium in a molar ratio of about 20:80 Si:Ge; and
    an interlayer dielectric layer formed over the silicon layer containing the at least one impurity.

11. The semiconductor device as claimed in claim 10, further comprising an etch stop layer formed between the gate structure and the silicon layer containing at least one impurity.

12. The semiconductor device as claimed in claim 11, wherein the etch stop layer is formed of SiN or SiON.

* * * * *